United States Patent
Leng (10) Patent No.: US 11,094,628 B2
(45) Date of Patent: Aug. 17, 2021

(54) TECHNIQUES FOR MAKING INTEGRATED INDUCTORS AND RELATED SEMICONDUCTOR DEVICES, ELECTRONIC SYSTEMS, AND METHODS

(71) Applicant: Microchip Technology Incorporated, Chandler, AZ (US)

(72) Inventor: Yaojian Leng, Portland, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 16/549,635

(22) Filed: Aug. 23, 2019

(65) Prior Publication Data

US 2021/0020568 A1    Jan. 21, 2021

Related U.S. Application Data (60) Provisional application No. 62/875,917, filed on Jul. 18, 2019.

(51) Int. Cl.
| | |
|---|---|
| *H01L 23/522* | (2006.01) |
| *H01L 23/00* | (2006.01) |
| *H01L 49/02* | (2006.01) |
| *H01L 21/768* | (2006.01) |

(52) U.S. Cl.
CPC .... *H01L 23/5227* (2013.01); *H01L 21/76802* (2013.01); *H01L 21/76843* (2013.01); *H01L 24/08* (2013.01); *H01L 28/10* (2013.01); *H01L 2924/01013* (2013.01); *H01L 2924/01029* (2013.01)

(58) Field of Classification Search
None
See application file for complete search history.

(56) References Cited

U.S. PATENT DOCUMENTS

| | | | |
|---|---|---|---|
| 6,362,012 B1 | 3/2002 | Chi et al. | |
| 8,344,479 B2 | 1/2013 | Pitts et al. | |
| 10,199,157 B2 * | 2/2019 | Tsai | H01F 41/04 |
| 2008/0157217 A1 | 7/2008 | Burke et al. | |
| 2008/0237789 A1 | 10/2008 | He et al. | |

(Continued)

FOREIGN PATENT DOCUMENTS

| | | |
|---|---|---|
| EP | 1425844 B1 | 1/2011 |

OTHER PUBLICATIONS

International Search Report for International Application No. PCT/US2019/047911, dated Mar. 30, 2020, 4 pages.

(Continued)

*Primary Examiner* — Robert K Carpenter
(74) *Attorney, Agent, or Firm* — TraskBritt (57) ABSTRACT

In some embodiments, integrated inductors may be built using processes for forming interconnects of semiconductor devices without requiring additional process steps. Integrated inductor coils may be formed by, for example, shunting an overlying electrically conductive material, such as, for example, bond pad metals (e.g., aluminum and alloys thereof), to an underlying electrically conductive material, such as, for example, an uppermost layer of wiring formed using Damascene processes (e.g., utilizing copper and alloys thereof), without vias to interconnect the two materials. In some embodiments, integrated inductors formed utilizing such processes may have a symmetric spiral design.

19 Claims, 6 Drawing Sheets

(56) References Cited

U.S. PATENT DOCUMENTS

| | | |
|---|---|---|
| 2009/0322447 A1 | 12/2009 | Daley et al. |
| 2012/0056297 A1 | 3/2012 | Akhtar et al. |
| 2014/0042612 A1 | 2/2014 | Liu et al. |
| 2016/0254266 A1 | 9/2016 | Yang et al. |
| 2017/0149404 A1 | 5/2017 | Tsai et al. |
| 2017/0200547 A1 | 7/2017 | Yen et al. |
| 2017/0288707 A1 | 10/2017 | Berdy et al. |
| 2017/0345559 A1 | 11/2017 | Vanukura |
| 2018/0277624 A1 | 9/2018 | Schultz |
| 2019/0259701 A1 | 8/2019 | Cheng et al. |

OTHER PUBLICATIONS

International Written Opinion for International Application No. PCT/US2019/047911, dated Mar. 30, 2020, 11 pages.

U.S. Trademark U.S. Appl. No. 16/549,635, filed Aug. 23, 2019, entitled "Techniques for Making Integrated Inductors and Related Semiconductor Devices, Electronic Systems, and Methods".

Chen et al., "On-Chip Spiral Inductors for RF Applications: An Overview," Journal of Semiconductor Technology and Science, Sep. 2004, vol. 4, No. 3, pp. 149-167.

\* cited by examiner

TECHNIQUES FOR MAKING INTEGRATED INDUCTORS AND RELATED SEMICONDUCTOR DEVICES, ELECTRONIC SYSTEMS, AND METHODS

CROSS-REFERENCE TO RELATED APPLICATION

This application claims the benefit of the priority date of U.S. Provisional Patent Application No. 62/875,917, filed Jul. 18, 2019, and titled "Techniques for Making Integrated Inductors and Related Semiconductor Devices, Electronic Systems, and Methods," the disclosure of which is incorporated herein in its entirety by this reference.

FIELD

This disclosure relates generally to electrical components for semiconductor devices and related systems and methods. More specifically, disclosed embodiments relate to techniques for configuring and making integrated inductors of semiconductor devices that may increase the quality of the integrated inductors and reduce the quantity of dedicated processing acts to make the integrated inductors.

BACKGROUND

Jack Kilby and Robert Noyce revolutionized the semiconductor industry by pioneering Integrated Circuits (ICs). In conventional ICs, a fully functional device with multiple, interconnected transistors is formed using usually aluminum or copper wire, and the transistors are built monolithically on a silicon substrate, instead of building individual transistors. In addition to the transistors, other components that would conventionally be provided on a Printed Circuit Board (PCB) may be built monolithically onto the same silicon substrate. This configuration is sometimes referred to in the art as a "System-On-Chip" (SoC). Integrated inductors, sometime called on-chip inductors, or thin-film inductors are among the components that may be formed using SoC integration.

According to conventional methods known to the inventors, integrated inductors may be built at the end of the IC formation process, with dedicated process steps. For example, a single-layer inductor may be built using 4 µm-thick aluminum wire, which may involve aluminum deposition and metal etch processes. A two-layer inductor may be built with two layers of 2 µm-thick aluminum wire, with the bottom layer planarized by Chemical Mechanical Polishing (CMP). In such situations, thick (up to 4 or 5 µm) dielectric deposition, and long polishing (up to 5 minutes) may be required. All these dedicated process steps add additional cost to the manufacture processes.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular electronic system, substrate, bond pad, integrated inductor, or component thereof, but are merely idealized representations employed to describe illustrative embodiments. Thus, the drawings are not necessarily to scale. Throughout this description, like reference numerals refer to the same or similar elements, regardless of whether those elements are expressly highlighted or discussed in connection with a given figure.

Disclosed embodiments relate generally to techniques for configuring and making integrated inductors of semiconductor devices that may increase the quality of the integrated inductors and reduce the quantity of dedicated processing steps to make the integrated inductors. For example, integrated inductors in accordance with certain embodiments of this disclosure may include two quantities of electrically conductive material directly shunted together to form the wiring coils of the integrated inductors: copper wiring in the uppermost layer of those portions (e.g., layers) of an interconnect formed using Damascene processes and aluminum material located over the copper wiring. This direct shunting approach may enable integrated inductors to be formed from the same materials, and utilizing the same processes, as those used to form bond pads of the interconnect. In addition, the direct shunting approach and the use of a dual-layer-material in certain embodiments may enable new techniques and structures for overpass/underpass regions of spiral inductors. As a result of these and other aspects of the following disclosure, integrated inductors in accordance with this disclosure may reduce (e.g., eliminate) reliance on passive electronic components provided separately from a semiconductor chip (e.g., on a printed circuit board), enable greater flexibility in designing wholly integrated circuits (e.g., systems on a chip), reduce the number of dedicated process steps required to form integrated inductors (e.g., may be free from a process point of view), and produce higher-inductance, lower-resistance, and lower-capacitance integrated inductors.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

Figure 1:
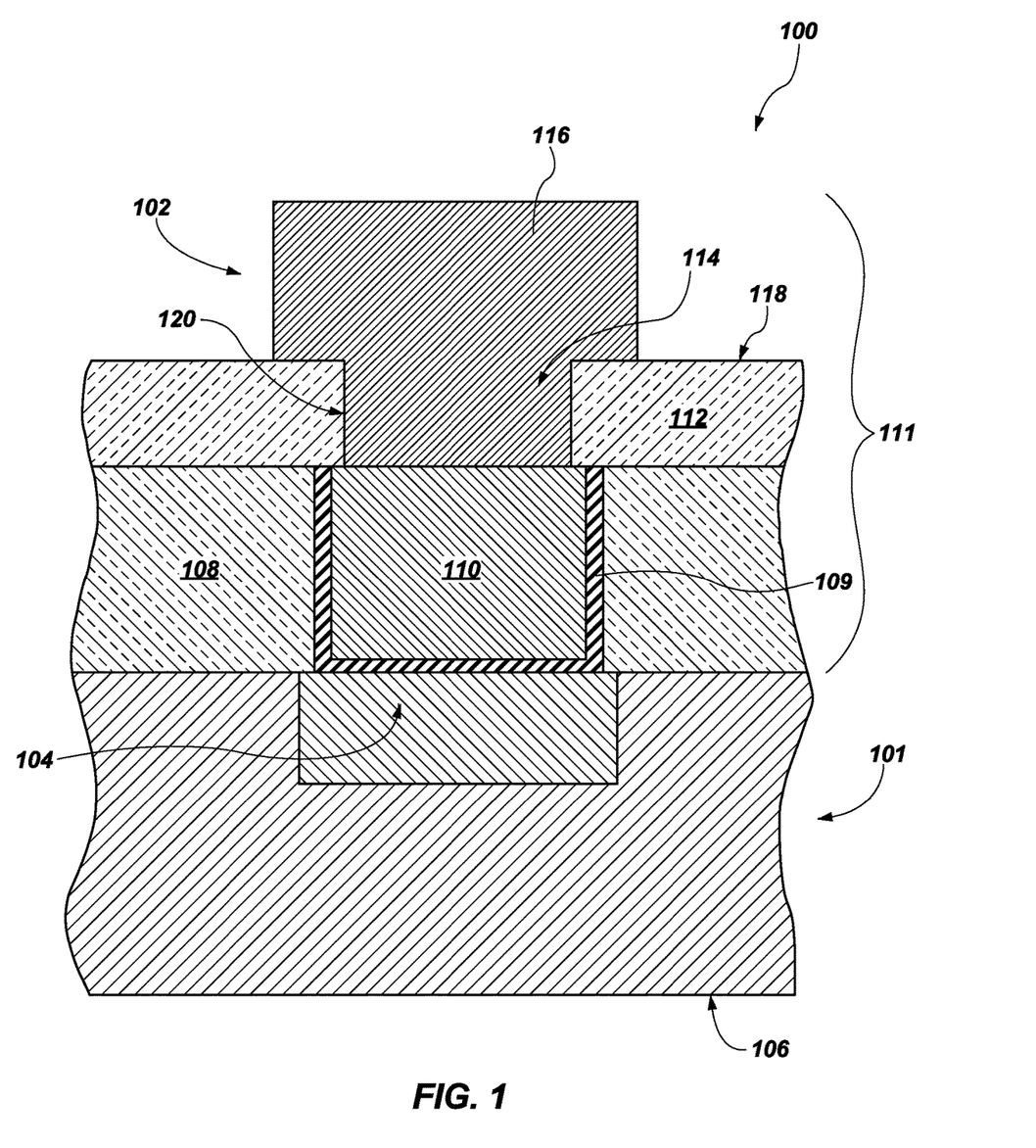
FIG. 1 is a cross-sectional view of a portion of a substrate depicting a bond pad supported on an interconnect of the substrate.
Figure 3:
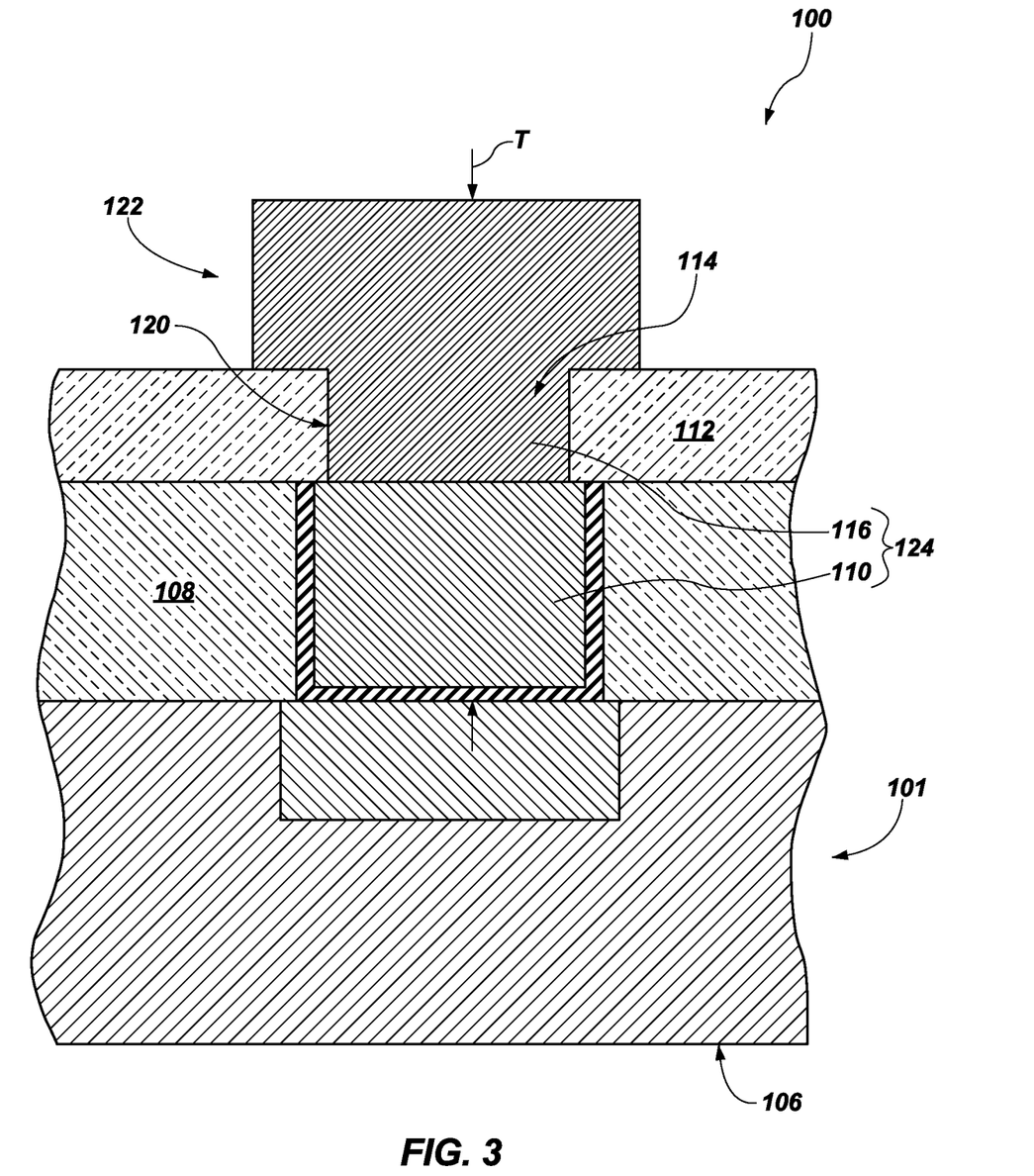
FIG. 3 is a cross-sectional view of a first portion of the integrated inductor of FIG. 2.
Figure 4:
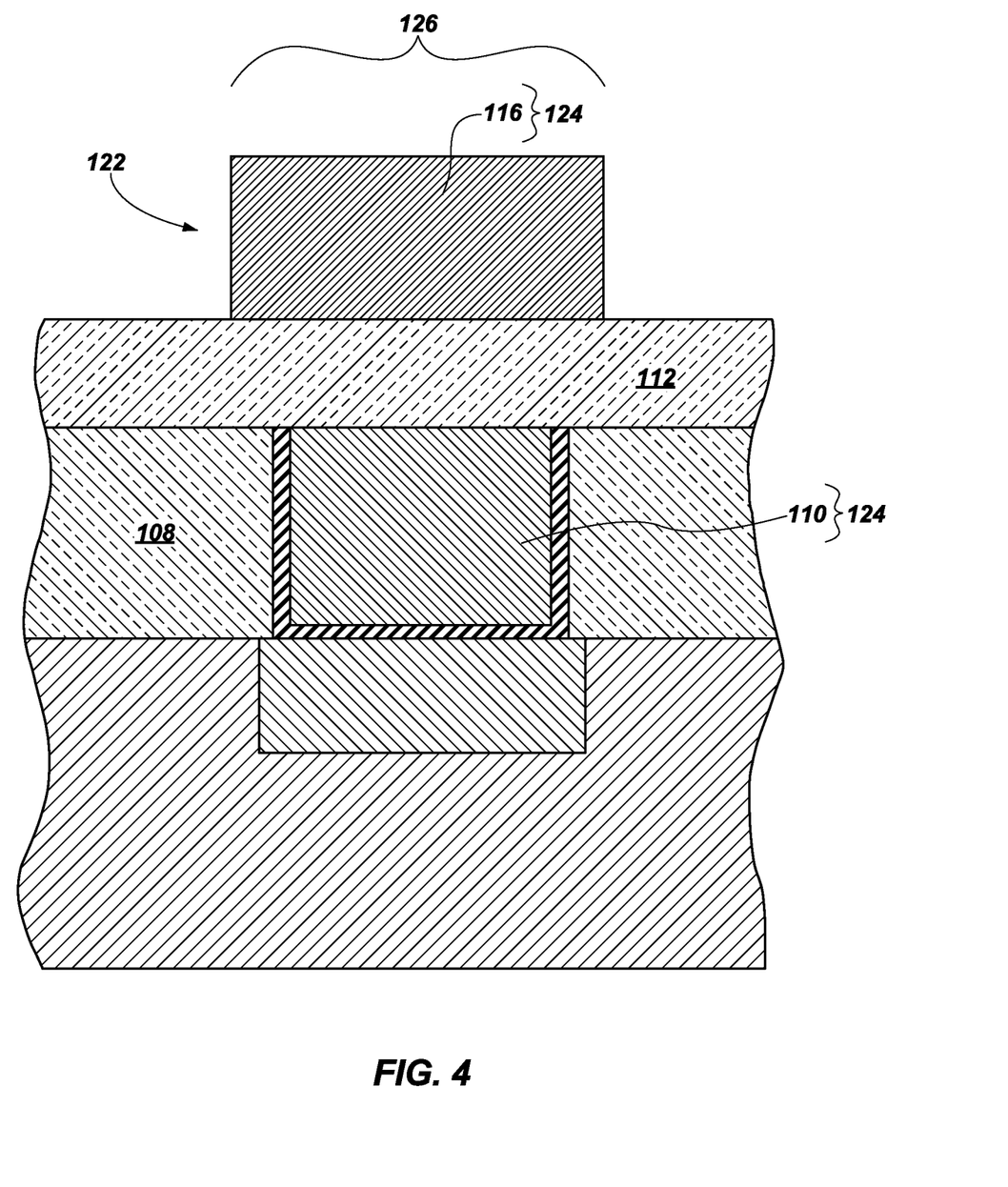
FIG. 4 is a cross-sectional view of another portion of the integrated inductor of FIG. 2.

FIG. 1 is a cross-sectional view of a portion of a semiconductor device 100 of a semiconductor device depicting a bond pad 102 supported by a substrate 101 having a major surface 106. The substrate 101 may include a semiconductor material, such as, for example, silicon, germanium, or silicon-on-insulator (SOI) on which integrated circuitry may be formed. The substrate 101 may include transistor regions 104 having integrated circuitry therein and/or thereon. For example, transistors may be built over or within the semiconductor material of the substrate 101 in the transistor regions 104. The semiconductor device 100 may include an interconnect 111 at or on the transistor regions 104, the interconnect 111 including, among other structures, an electrically conductive material 110 partially surrounded by, or embedded in, a dielectric material 108. The interconnect 111 may be utilized to electrically and operatively connect to the semiconductor devices of the transistor regions 104. For example, the electrically conductive material 110 may be in the form of a top-most wire created through a Damascene process on the substrate 101, which electrically conductive material 110 may be partially surrounded by a thin barrier material 109 (e.g., Ta, TaN) interposed between the electrically conductive material 110 and the dielectric material 108. For the sake of simplicity, only the uppermost layer of those portions (e.g., layers) of an interconnect 111 preferably formed utilizing a Damascene process is depicted in FIGS. 1, 3, and 4, however, interconnects 111 in accordance with this disclosure may include additional layers, such as, for example, layers interposed between. The electrically conductive material 110 may include, for example, a metal or metal alloy material (e.g., copper, aluminum, copper alloy, aluminum alloy). The dielectric material 108 may include one or more dielectric materials, such as, for example, an oxide (e.g., SiO, SiO$_2$). The dielectric material 108 may be in the form of, for example, a layer on, or over, the transistor regions 104 of the semiconductor device 100.

A passivation material 112 may be located over the dielectric material 108, the thin barrier material 109, and the electrically conductive material 110. For example, the passivation material 112 may be in direct contact with the uppermost layer of an interconnect 111 formed utilizing a Damascene process. The passivation material 112 may include one or more dielectric materials, such as, for example, oxides, nitrides, glasses, polymers, or combinations or subcombinations of these (e.g., SiON, SiO, SiN, silicon-rich nitride, phosphosilicate glass). More specifically, the passivation material 112 may include, for example, a layer of SiN located proximate to the dielectric material 108, a layer of silicon-rich oxide located on the SiN, a layer of phosphosilicate glass located on the silicon-rich oxide, and a layer of SiON located on the phosphosilicate glass. The passivation material 112 may cover, for example, at least a portion of the dielectric material 108, the barrier material 109, and portions of the electrically conductive material 110.

Openings 114 in the passivation material 112 may grant access to the remainder of the electrically conductive material 110. For example, the bond pad 102 may include another, different electrically conductive material 116 located within an associated opening 114. The other electrically conductive material 116 may include, for example, a metal or metal alloy material (e.g., copper, aluminum, copper alloy, aluminum alloy), however the constituent material of the other electrically conductive material 116 may be different from the constituent material of the electrically conductive material 110. As a specific, nonlimiting example, the other electrically conductive material 116 may include aluminum alloyed with 0.5% by weight copper. The opening 114 may be in the shape of, for example, a rectangular cylinder. The other electrically conductive material 116 may be in direct contact with, and electrically connected to, an associated portion of the electrically conductive material 110, and may extend from the associated portion of the electrically conductive material 110, through the passivation material 112, to at least an exposed surface 118 of the passivation material 112 (e.g., at least flush with the exposed surface 118 of the passivation material 112). More specifically, the other electrically conductive material 116 may extend from direct contact with the electrically conductive material 110, through the passivation material 112, and beyond the passivation material 112, the protruding portion of the other electrically conductive material 116 extending laterally beyond sidewalls 120 of the passivation material 112 defining the opening 114 to form the bond pad 102.

Figure 2:
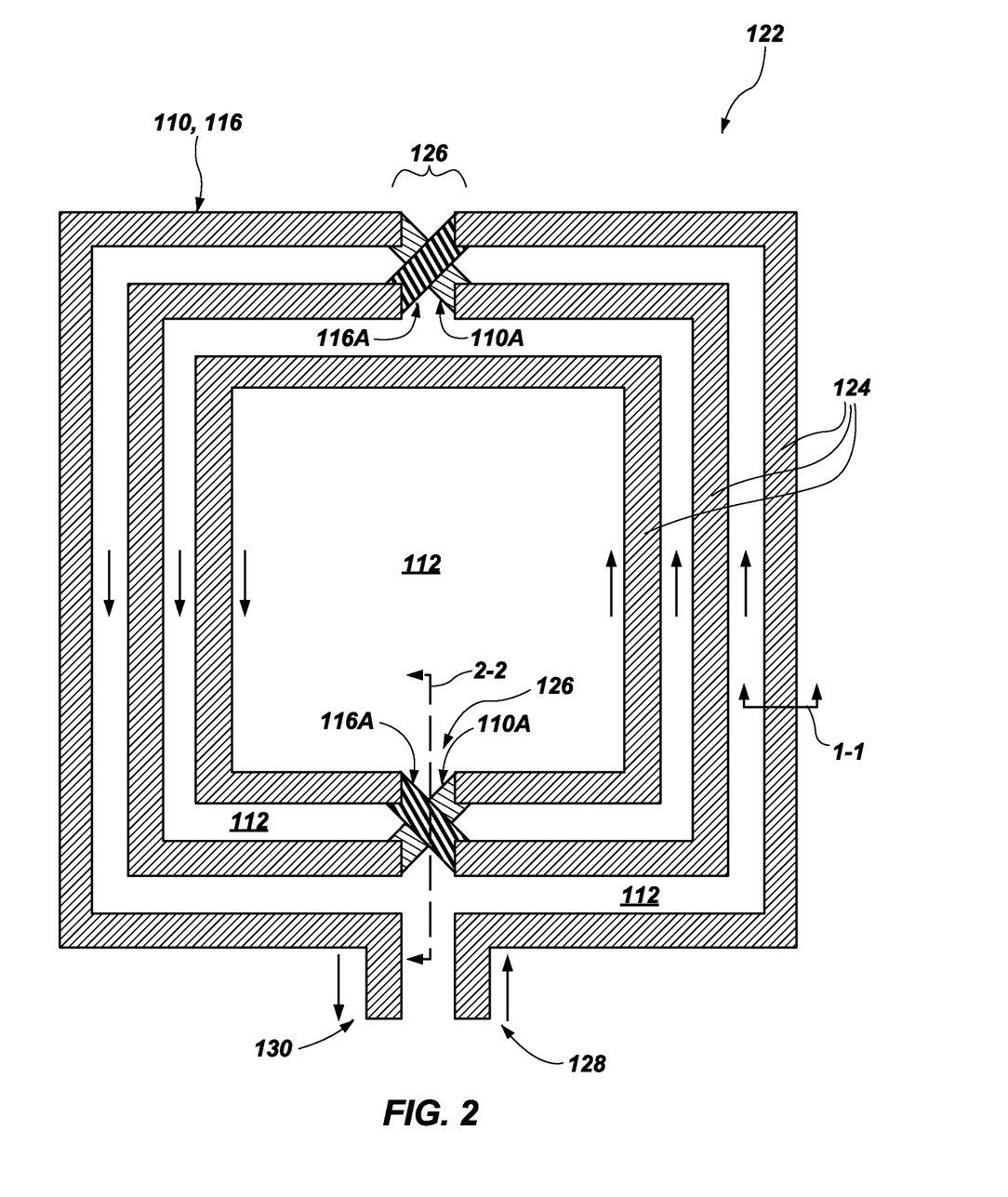
FIG. 2 is a top surface view of another portion of the substrate of FIG. 1 depicting an integrated inductor in accordance with this disclosure supported by the substrate.

FIG. 2 is a top surface view of another portion of the semiconductor device 100 of FIG. 1 depicting an integrated inductor 122 in accordance with this disclosure supported by the substrate 101. When it is said that the inductor 122 is "integrated," what is meant is that the inductor 122 is onboard the substrate 101 of the semiconductor device 100, as opposed to being a discrete component provided with, and connected to, a supporting structure to which the substrate 101 may be connected, such as, for example, a printed circuit board. For example, integrated inductor 122 may be a component of a system-on-a-chip configuration for semiconductor devices 100. The integrated inductor 122 may be located in the same layers described regarding the interconnect 111 (see FIG. 1). The integrated inductor 122 may include coils 124 extending from an input location 128 to an output location 130, the coils 124 forming a winding path from a radially outermost coil 124 to a radially innermost coil 124 and back again (or vice versa). The coils 124 may be formed from, for example, wires, lines, traces, and/or other structures for directing electrical current through the integrated inductor 122. Quantities of the passivation material 112 may be located, for example, at a radial center of the integrated inductor 122 (e.g., radially within the coils) and radially between each radially adjacent coil 124. The coils 124 may have a generally rectangular (e.g., square), polygonal (e.g., hexagonal, octagonal), or circular shape when viewed in a plane parallel to a major surface 106 of the substrate 101 (e.g., depending on magnetic flux, length, and resistance specifications for the integrated inductor 122). In some embodiments, the coils 124 may be symmetrical (e.g., having essentially the same mirrored shape about a line of symmetry, with multiple overpass/underpass regions 126). In other embodiments, the coils 124 may be asymmetrical (e.g., having at least one difference when mirrored about a line of symmetry, such as having an overpass/underpass region 126 on one lateral side without a corresponding overpass/underpass region 126 on the opposite lateral side).

To interconnect radially adjacent coils 124, forming a spiral of the integrated inductor 122, the integrated inductor 122 may include, for example, one or more overpass/underpass regions 126. The overpass/underpass region(s) 126 may include an electrically isolated portion 110A (e.g., an underpass portion) of one coil 124 under another electrically isolated portion 116A (e.g., an overpass portion) of another coil 124, the passivation material 112 being located between the electrically isolated portion 110A of the one coil and the other electrically isolated portion 116A of the other coil 124. More specifically, each overpass/underpass region 126 may include an electrically isolated portion 110A or 116A of a radially outer coil 124 extending toward a radially inner coil 124 over or under an electrically isolated portion 110A or 116A of another radially inner coil 124 extending toward another radially outer coil 124. The integrated inductor 122 may include, for example, one overpass/underpass region 126 fewer than the number of coils 124 (e.g., turns)

included in the integrated inductor 122. For example, the integrated inductor 122 shown in FIG. 2 includes three coils 124 and two overpass/underpass regions 126. The electrically isolated portions 110A and 116A of the coils 124 within the overpass/underpass regions 126 are depicted as being oriented at oblique angles relative to the other portions of the coils 124. However, electrically isolated portions of the coils 124 within the overpass/underpass regions 126 may take any path leading between the adjacent coils 124 within the plane of the respective electrically isolated portion 110A or 116A, such as, for example, a stair-step pattern with portions of the stairs alternately extending parallel, then perpendicular, then parallel and so on to the coils 124. In addition, integrated inductors 122 in accordance with this disclosure may include any number of coils 124 (e.g., turns).

FIG. 3 is a cross-sectional view of a first portion of the integrated inductor 122 of FIG. 2 taken along line 1-1 in FIG. 2. The portion depicted in FIG. 3 may correspond to those portions of the coils 124 not forming the overpass/underpass regions 126. In such sections, the coils 124 may include the electrically conductive material 110 partially surrounded by the dielectric material 108, the other electrically conductive material 116 in direct contact with the electrically conductive material 110 with the passivation material 112 flanking at least a portion of the other electrically conductive material 116 on two lateral sides, and optionally another portion of the other electrically conductive material 116 extending beyond the passivation material in a direction perpendicular to the major surface 106 and optionally laterally beyond the sidewalls 120 defining the opening 114. In embodiments where a portion of a coil 124 is formed from the electrically conductive material 110 and the other electrically conductive material 116, the opening 114 may be in the shape of, for example, a trench.

In some instances, the quality factor of an integrated inductor 122 may be evaluated utilizing the following equation:

$$Q = \frac{\omega \times L}{R},$$

where Q is quality factor, ω is the angular frequency of a signal propagating along the integrated inductor 122, L is the inductance of the integrated inductor 122, and R is the series resistance of the integrated inductor 122. Utilizing such an equation, the higher values for the quality factor Q may indicate a better-performing integrated inductor 122 than lower values for the quality factor Q. Integrated inductors 122 configured in accordance with this disclosure, including the electrically conductive material 110 in direct contact with the other electrically conductive material 116, may have a higher quality factor Q at least partially because the cross-sectional area of the coils 124 resulting from the direct shunting together of two masses of electrically conductive materials 110 and 116 may reduce the resistance R of the coils 124. A combined thickness T of the electrically conductive material 110 and the other electrically conductive material 116, as measured in a direction perpendicular to the major surface 106, may be, for example, at least about 1 µm. More specifically, the combined thickness T of the electrically conductive material 110 and the other electrically conductive material 116 may be, for example, between about 1 µm and about 6 µm. As a specific, nonlimiting example, the combined thickness T of the electrically conductive material 110 and the other electrically conductive material 116 may be, for example, between about 2 µm and about 5 µm (e.g., about 4 µm).

In contrast to conventional stacked integrated inductors known to the inventor of the subject matter of this disclosure, which may form connections between upper and lower quantities of electrically conductive materials utilizing resistive vias (e.g., tungsten contacts) extending through passivation materials, integrated inductors 122 in accordance with this disclosure may form connections between upper and lower quantities of electrically conductive materials 110 and 116 utilizing direct contact to electrically connect one electrically conductive material 110 to another electrically conductive material 116. Such integrated inductors 122 may be free of vias in direct contact with the integrated inductors 122, though vias may be included in other portions of semiconductor devices 100 supporting the integrated inductors 122, which vias may be indirectly connected to the integrated inductors 122. For example, the overpass/underpass region(s) 126 may be free of vias extending through the passivation material 112. For example, the integrated inductors 122 may be free of vias extending between the electrically conductive material 110 and the other electrically conductive material 116 of the integrated inductor 122. Utilizing direct contact, rather than vias, may enable the coils 124 to utilize the combined cross-sectional areas of both electrically conductive materials 110 and 116 to reduce resistance R and capacitance along greater lengths of the coils 124 than conventionally possible with vias, further increasing the quality factor Q.

The integrated inductors 122 in accordance with this disclosure may be made from the same materials as bond pads 102 (see FIG. 1) in some embodiments. In addition, the respective portions of the integrated inductors 122 may be located at the same positions as measured in a direction perpendicular to the inactive major surface 106. More specifically, the electrically conductive material 110 of the integrated inductor(s) 122 and the bond pad(s) 102 may be within the uppermost layer of copper wiring of the interconnect 111 formed utilizing Damascene processes, and the other electrically conductive material 116 of the integrated inductor(s) 122 and the bond pad(s) 102 may overlie, and be in direct contact with, at least portions of the electrically conductive material 110.

FIG. 4 is a cross-sectional view of another portion of the integrated inductor 122 of FIG. 2 taken along line 2-2 in FIG. 2. The portion depicted in FIG. 3 may correspond to those portions of the coils 124 forming the overpass/underpass regions 126. In such sections, the electrically conductive material 110 partially surrounded by the dielectric material 108 of one coil 124 having a first radial distance from the radial center may be covered by the passivation material 112, and the other electrically conductive material 116 of another coil 124 having a second, different, radial distance from the radial center may be located on a side of the passivation material 112 opposite the electrically conductive material 110 of the one coil 124. The other electrically conductive material 116 of the one coil 124 may be omitted within the overpass/underpass region 126, a portion of the space that would otherwise be occupied by the other electrically conductive material 116 overlying the electrically conductive material 110 being occupied instead by the passivation material 112. The electrically conductive material 110 and a portion of the other electrically conductive material 116 of the other coil 124 may be omitted within the overpass/underpass region 126, the passivation material 112 being interposed between the remaining portion of the other electrically conductive material 116 of the other coil 124 and the electrically conductive material 110 of the one coil 124. Thus, the passivation material 112 may electrically isolate a portion of the other electrically conductive material 116 passing over the passivation material 112 from the electrically conductive material 110 passing under the passivation material 112.

In other words, the electrically conductive material 110A of the one coil 124 passing under the other coil 124 may extend continuously from before the overpass/underpass region 126, through the overpass/underpass region 126, and beyond the overpass/underpass region 126. The other electrically conductive material 116 of the one coil 124 may be discontinuous, extending toward the overpass/underpass region 126 to a location abutting the overpass/underpass region 126 on one lateral side of the overpass/underpass region, being entirely omitted within the overpass/underpass region 126, and extending away from the overpass/underpass region 126 from a location abutting the overpass/underpass region 126 on another, opposite lateral side of the overpass/underpass region 126. A portion of the other electrically conductive material 116A of the other coil 124 passing over the one coil 124 may extend at least substantially continuously from before the overpass/underpass region 126, through the overpass/underpass region 126, and beyond the overpass/underpass region 126. Another portion of the other electrically conductive material 116 of the other coil 124 corresponding to a location where passivation material 112 is interposed between the electrically conductive material 110A of the one coil 124 and the other electrically conductive material 116A of the other coil 124 in the overpass/underpass region 126 may be omitted within the overpass/underpass region 126. That portion of the other electrically conductive material 116 of the other coil 124 may be discontinuous, extending toward the overpass/underpass region 126 to a location abutting the overpass/underpass region 126 on one lateral side of the overpass/underpass region, being omitted within the overpass/underpass region 126, and extending away from the overpass/underpass region 126 from a location abutting the overpass/underpass region 126 on another, opposite lateral side of the overpass/underpass region 126. The electrically conductive material 110 of the other coil 124 may also be discontinuous, extending toward the overpass/underpass region 126 to a location abutting the overpass/underpass region 126 on one lateral side of the overpass/underpass region, being entirely omitted within the overpass/underpass region 126, and extending away from the overpass/underpass region 126 from a location abutting the overpass/underpass region 126 on another, opposite lateral side of the overpass/underpass region 126. Separation of one electrically conductive material 110A from the other electrically conductive material 116A in an overpass/underpass fashion within the overpass/underpass region 126 may increase resistance of the coils 124 in the overpass/underpass region 126. However, the increase in resistance may not significantly affect the quality factor of the integrated inductor 122 (e.g., may have a negligible effect on the quality factor of the integrated inductor 122) because the overpass/underpass region 126 is relatively small compared to the entire lengths of the coils 124 of the integrated inductor 122.

Figure 5:
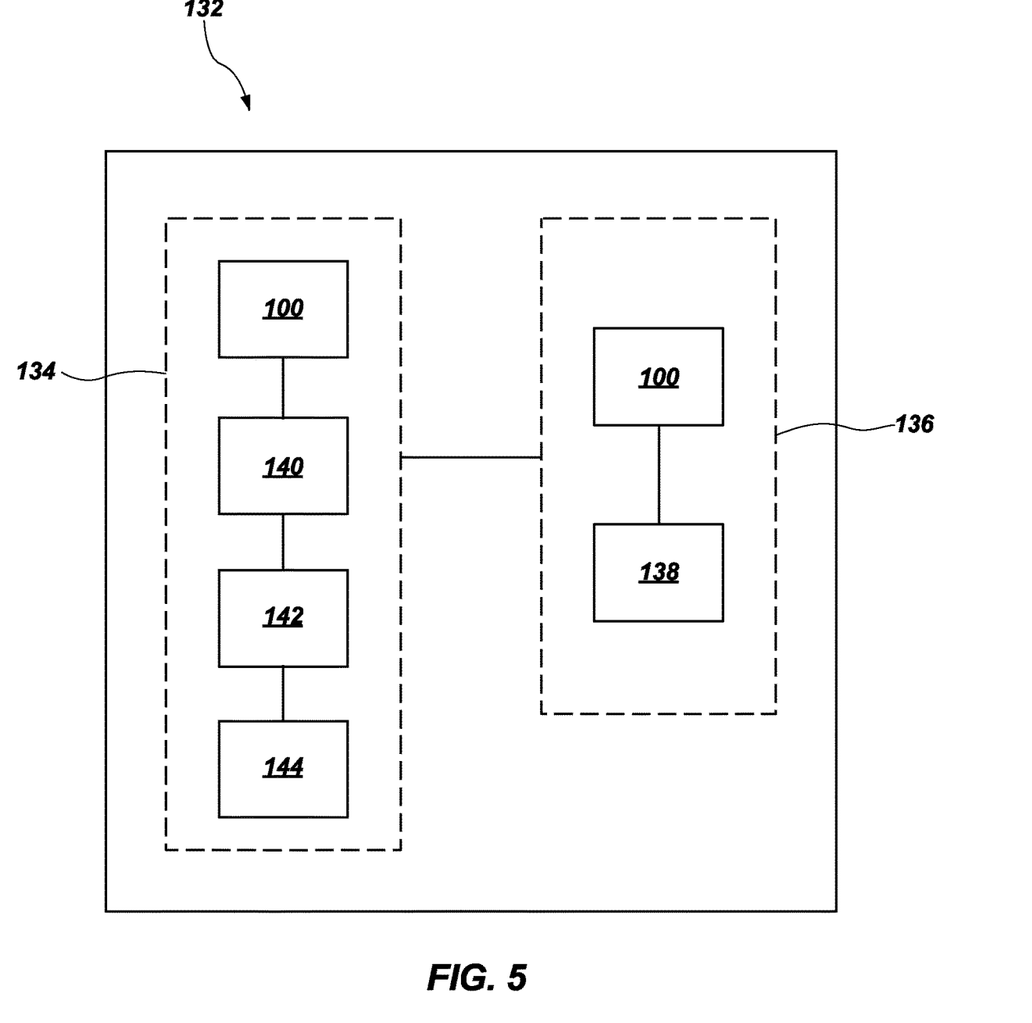
FIG. 5 is a schematic diagram of an electronic system including the substrate of FIGS. 1 through 4.

FIG. 5 is a schematic diagram of an electronic system 132 including the semiconductor device 100 of FIGS. 1 through 4. For example, the electronic system 132 may include a control unit 134 and a probe unit 136. The probe unit 136 may be include a sensor device 138 configured to generate an electrical signal representative of, and in response to, a detected physical phenomenon. The probe unit 136 may be a portable device, such as, for example, a handheld device. In some embodiments, the probe unit 136 may include a semiconductor device 100 including a substrate 101 (see FIGS. 1, 3, 4) in accordance with this disclosure located within the probe unit 136, the substrate 101 (see FIGS. 1, 3, 4) of the semiconductor device 100 configured to at least partially process the electrical signal locally within the probe unit 136. The probe unit 136 may be operatively connected to the control unit 134 (e.g., over a wired or wireless connection) and may send the raw, partially processed, or fully processed electrical signal to the control unit 134. In some embodiments, the control unit 134 may include another semiconductor device 100 having a substrate 101 in accordance with this disclosure or a microprocessor 140, which may process or further process the electrical signal. The control unit 134 may include a memory device 142 (i.e., a physical, hardware memory device that is not a transitory signal) configured to store the results of the fully processed electrical signal. The control unit 134 may optionally include an output device 144 (e.g., an electronic display, an audio speaker, a printer, etc.) configured to output the results of the fully processed electrical signal.

Semiconductor devices having integrated inductors in accordance with this disclosure may be particularly useful when implemented in devices employing radio frequency, millimeter wave, power supply (e.g., power supply on chip) circuits, such as, for example, low-noise amplifiers, resonant loads, matching networks, radio frequency filters, integrated voltage regulators, switch mode power supplies, and/or buck-boost converters. The low-cost, high-quality constructions for integrated inductors 122 in accordance with this disclosure may render such electronic systems 132 less costly to produce and more reliable in operation.

Figure 6:
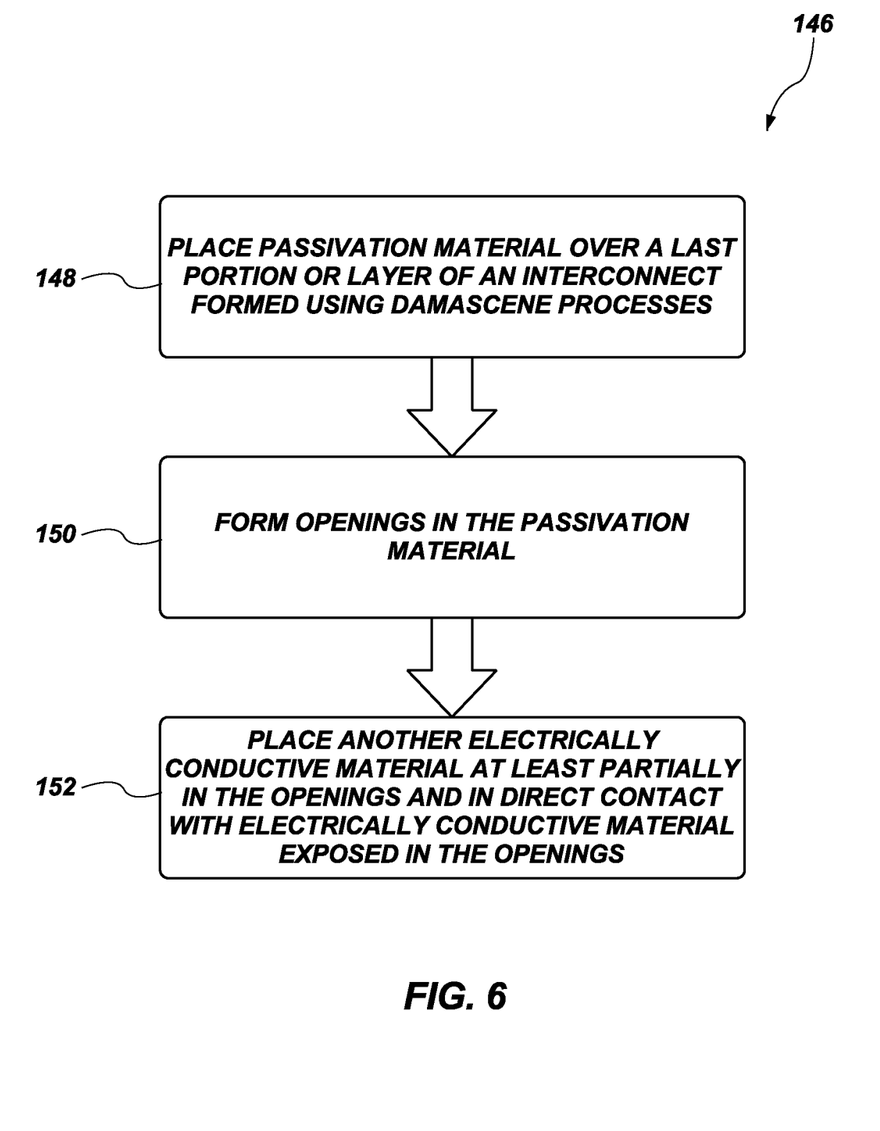
FIG. 6 is a flowchart of a method of making a substrate in accordance with this disclosure.

FIG. 6 is a flowchart of a method 146 of making a semiconductor device 100 in accordance with this disclosure. Referring collectively to FIGS. 1 through 4 and 6, the method 146 may involve depositing the passivation material 112 over the last portion or layer of the interconnect 111 formed utilizing Damascene processes by, for example, utilizing plasma-enhanced chemical vapor deposition (PE-VCD), as shown at act 148. More specifically, the passivation material 112 may be placed by, for example, depositing the passivation material 112 over uppermost quantities of the dielectric material 108, barrier material 109, and electrically conductive material 110 forming the last layer of wiring of the interconnect 111 formed utilizing Damascene processes. In some embodiments, as a precursor to placement of the passivation material 112, one or more portions of the semiconductor device 100 may be formed, such as, for example, by forming the interconnect 111, including the uppermost layer depicts in FIGS. 1, 3, and 4, using Damascene processes. In other embodiments, the semiconductor device 100 including the dielectric material 108 and electrically conductive material 110 may be provided as a preformed, precursor component.

The method 146 may further involve forming openings 114 in the passivation material 112, as shown at act 150. The openings 114 may be formed utilizing, for example, mask and etch processes. In those portions of the integrated inductor(s) 122 not forming the overpass/underpass regions 126 and in the locations of the bond pad(s) 102, the openings 114 may expose the electrically conductive material 110, substantially completely removing the passivation material 112 previously located in the openings (e.g., save for trace amounts resulting from limitations of manufacturing capabilities). In the overpass/underpass regions 126, openings 114 may not be formed in the passivation material 112, leaving the passivation material 112 intact in the overpass/underpass regions 126 in some embodiments. In some embodiments, openings 114 for the bond pad(s) 102 may be formed concurrently while forming openings 114 for the coils 124 of the integrated inductor(s) 122. For example, the openings 114 for the bond pad(s) 102 and the openings 114 for the coils 124 of the integrated inductor(s) 122 may be formed using the mask and etching processes, with no separate processes being required to make the openings 114.

The method 146 may also involve placing (e.g., depositing) the other electrically conductive material 116 at least partially within the openings 114 and, in some sections, in direct contact with the electrically conductive material 110 exposed within the openings 114, as indicated at act 152. The electrically conductive material 116 may be placed utilizing for example, physical vapor deposition processes (PVD). In some embodiments, a mask may be placed or remain on the passivation material 112 to impart a desired size and shape to the other electrically conductive material 116 extending above the passivation material 112.

When compared to conventional configurations of, and techniques for forming, integrated inductors, configurations of, and techniques for forming, integrated inductors in accordance with this disclosure may involve performing fewer process acts, have greater synergy with process acts used for forming other structures (e.g., bond pads), reduce reliance on dedicated process acts and interconnection structures (e.g., vias and those acts for forming vias), and produce higher-quality integrated inductors. For example, techniques for forming integrated inductors in accordance with this disclosure may enable integrated inductors to be formed concurrently with, and using the same materials as, bond pads of the same semiconductor device. As another example, integrated inductors having configurations in accordance with this disclosure may have higher inductance, lower resistance, and lower capacitance as a result, producing higher-quality integrated inductors.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventor.

What is claimed is:

1. A semiconductor device, comprising:
a substrate comprising a semiconductor material; and
an integrated inductor comprising coils supported by the substrate, the coils comprising:
an electrically conductive material at an uppermost portion of an interconnect formed on the substrate;
another, different electrically conductive material in direct contact with portions of the electrically conductive material, the other different electrically conductive material embedded in a dielectric material with a barrier material interposed between the other, different electrically conductive material and the dielectric material; and
an overpass/underpass region in which an electrically isolated portion of the electrically conductive material extends under another electrically isolated portion of the other electrically conductive material, a passivation material located between the electrically isolated portion of the portion of the electrically conductive material and the other portion of the other electrically conductive material;
wherein a portion of the passivation material covers corresponding portions of the barrier material and the other, different electrically conductive material.

2. The semiconductor device of claim 1, wherein the integrated inductor is free of through-hole type vias between the electrically conductive material and the other electrically conductive material of the integrated inductor.

3. The semiconductor device of claim 1, wherein the electrically conductive material of the coils comprises a copper or copper alloy material and the other electrically conductive material comprises aluminum or aluminum alloy.

4. The semiconductor device of claim 1, wherein the integrated inductor is at least substantially symmetrical.

5. The semiconductor device of claim 1, wherein the electrically conductive material is located at an uppermost layer of those layers of the interconnect formed using Damascene processes.

6. A semiconductor device, comprising:
a substrate comprising a semiconductor material; and
an integrated inductor comprising coils supported by the substrate, the coils comprising:
an electrically conductive material in an uppermost layer of an interconnect formed the substrate embedded in a passivation material;
another electrically conductive material above the uppermost layer in direct contact with portions of the electrically conductive material, wherein the other electrically conductive material is different from the electrically conductive material, the other different electrically conductive material embedded in a dielectric material with a harder material interposed between the other, different electrically conductive material and the dielectric material, wherein a portion of the passivation material covers corresponding portions of the barrier material and the other electrically conductive material; and
an overpass/underpass region in which:
the electrically conductive material of one coil extends continuously from before the overpass/underpass region, through the overpass/underpass region, and beyond the overpass/underpass region;
a portion of the other electrically conductive material of another coil extends continuously from before the overpass/underpass region, through the overpass/underpass region and under the electrically conductive material of the one coil, and beyond the overpass/underpass region;
the other electrically conductive material of the one coil is discontinuous, extending toward the overpass/underpass region, being omitted within the overpass/underpass region, and extending away from the overpass/underpass region; and
the electrically conductive material of the other coil is discontinuous, extending toward the overpass/underpass region, being omitted within the overpass/underpass region, and extending away from the overpass/underpass region.

7. The semiconductor device of claim 6, wherein the integrated inductor is free of through-hole type vias extending between the electrically conductive material and the other electrically conductive material of the integrated inductor.

8. The semiconductor device of claim 6, wherein the electrically conductive material is located at an uppermost layer of those layers of the interconnect formed using Damascene processes.

9. A method of making a semiconductor device, comprising:
placing a passivation material over an interconnect formed on a semiconductor substrate;
exposing portions of coils of an integrated inductor supported on the substrate by removing portions of the passivation material, the portions of the coils comprising an electrically conductive material at an uppermost portion of the interconnect, the portions of the coils embedded in a dielectric material with a barrier material interposed between the other, different electrically conductive material and the dielectric material, wherein a portion of the passivation material covers corresponding portions of the harrier material and the other electrically conductive material;
placing another, different electrically conductive material in direct contact with the electrically conductive material of the portions of the coils to form the integrated inductor;
leaving another portion of the coils of the integrated inductor covered by another portion of the passivation material; and
placing a portion of the other electrically conductive material over another portion of the passivation material to form an overpass/underpass region, the other portion of the coils being electrically isolated from the portion of the other electrically conductive material located over the other portion of the passivation material.

10. The method of claim 9, wherein exposing the portions of the coils of the integrated inductor by removing the portions of the passivation material comprises exposing copper material supported at least partially within a barrier material of the substrate.

11. The method of claim 9, further comprising forming a bond pad concurrently while forming the integrated inductor by exposing a portion of the bond pad by removing another portion of the passivation material, the portion of the bond pad comprising the electrically conductive material, and placing the other electrically conductive material in direct contact with the portion of the bond pad.

12. An electronic system, comprising:
a substrate comprising a semiconductor material, the substrate supporting a radio frequency, millimeter wave, or power supply circuit;
wherein the radio frequency, millimeter wave, or power supply circuit comprises an integrated inductor comprising coils, the coils comprising:
an electrically conductive material proximate to a surface of the substrate, the electrically conductive material embedded in a passivation material;
another, different electrically conductive material in direct contact with portions of the electrically conductive material, the other different electrically conductive material embedded in a dielectric material with a harrier material interposed between the other, different electrically conductive material and the dielectric material, wherein a portion of the passivation material covers corresponding portions of the barrier material and the other electrically conductive material; and
an overpass/underpass region directing an electrically isolated portion of the electrically conductive material under another electrically isolated portion of the other electrically conductive material, the passivation material located between the electrically isolated portion of the portion of the electrically conductive material and the other portion of the other electrically conductive material.

13. The electronic system of claim 12, wherein the integrated inductor is free of through-hole type vias between the electrically conductive material and the other electrically conductive material of the integrated inductor.

14. The electronic system of claim 12, further comprising a bond pad comprising the electrically conductive material and the other electrically conductive material in direct contact with the electrically conductive material, the electrically conductive material of the bond pad at a same distance relative to an inactive surface of the substrate as the electrically conductive material of the integrated inductor, the other electrically conductive material of the bond pad at a same distance relative to an inactive surface of the substrate as the electrically conductive material of the integrated inductor.

15. An integrated inductor, comprising:
coils located partially within an interconnect of a semiconductor device, the coils comprising:
a first electrically conductive material located within an uppermost layer of an interconnect formed on the semiconductor device, the first electrically conductive material embedded in a dielectric material with a barrier material interposed between the First electrically conductive material and the dielectric material;
a second electrically conductive material overlying, and in direct contact with, the first electrically conductive material, the second electrically conductive material embedded in a passivation material, wherein a portion of the passivation material covers corresponding portions of the harrier material and the other electrically conductive material; and
an overpass/underpass region where the second electrically conductive material is electrically isolated from, and not indirect contact with, the first electrically conductive material.

16. The integrated inductor of claim 15, wherein the first electrically conductive material is different from the second electrically conductive material.

17. The integrated inductor of claim 16, wherein the first electrically conductive material comprises a copper or copper alloy material and the second electrically conductive material comprises aluminum or aluminum alloy.

18. The integrated inductor of claim 15, wherein the first electrically conductive material of one coil passing over another coil is discontinuous in the overpass/underpass region and the second electrically conductive material of the other coil passing under the one coil is discontinuous in the overpass/underpass region.

19. The semiconductor device of claim 15, wherein the electrically conductive material is located at an uppermost layer of those layers of the interconnect formed using Damascene processes.

* * * * *

UNITED STATES PATENT AND TRADEMARK OFFICE
CERTIFICATE OF CORRECTION

PATENT NO. : 11,094,628 B2  
APPLICATION NO. : 16/549635  
DATED : August 17, 2021  
INVENTOR(S) : Yaojian Leng Page 1 of 1

It is certified that error appears in the above-identified patent and that said Letters Patent is hereby corrected as shown below:

In the Claims

| | | | |
|---|---|---|---|
| Claim 6, | Column 10, | Line 38, | change "harder" to --barrier-- |
| Claim 9, | Column 11, | Line 21, | change "harrier" to --barrier-- |
| Claim 12, | Column 11, | Line 63, | change "harrier" to --barrier-- |
| Claim 15, | Column 12, | Line 34, | change "First" to --first-- |
| Claim 15, | Column 12, | Line 42, | change "harrier" to --barrier-- |

Signed and Sealed this  
Twenty-first Day of September, 2021

Drew Hirshfeld  
*Performing the Functions and Duties of the*  
*Under Secretary of Commerce for Intellectual Property and*  
*Director of the United States Patent and Trademark Office*